(12) United States Patent
Lin et al.

(10) Patent No.: US 6,178,136 B1
(45) Date of Patent: Jan. 23, 2001

(54) SEMICONDUCTOR MEMORY DEVICE HAVING Y-SELECT GATE VOLTAGE THAT VARIES ACCORDING TO MEMORY CELL ACCESS OPERATION

(75) Inventors: Heng-Chih Lin; Takumi Nasu; David B. Scott, all of Plano, TX (US)

(73) Assignee: Texas Instruments Incorporated, Dallas, TX (US)

(*) Notice: Under 35 U.S.C. 154(b), the term of this patent shall be extended for 0 days.

(21) Appl. No.: 09/405,264

(22) Filed: Sep. 23, 1999

Related U.S. Application Data

(60) Provisional application No. 60/102,122, filed on Sep. 28, 1998.

(51) Int. Cl.[7] .................................................. G11C 7/00
(52) U.S. Cl. ........................................ 365/230.06; 365/190
(58) Field of Search ........................ 365/230.06, 189.01, 365/189.11, 190, 149

(56) References Cited

U.S. PATENT DOCUMENTS

| | | | |
|---|---|---|---|
| 5,978,309 | * 11/1999 | Seyyedy et al. | 365/230.06 |
| 6,021,070 | * 2/2000 | Casper | 365/230.06 |
| 6,055,194 | * 4/2000 | Seo et al. | 365/230.06 |
| 6,055,207 | * 4/2000 | Nam | 365/230.06 |
| 6,061,292 | * 5/2000 | Su et al. | 365/230.06 |

OTHER PUBLICATIONS

Lin, et al., "Pattern Disclosure (2nd Draft) Different Y–Select Gate Voltage for Read/Write Operations in DRAM", Pattern Disclosure Supplemental Materials, Feb. 20, 1998, pp. 100–103.

Evert Seevinck, et al., "Static–Noise Margin Analysis of MOS SRAM Cells", IEEE Journal of Solid–State Circuits, vol. SC–22, No. 5, Oct. 1987, pp. 748–754.

* cited by examiner

*Primary Examiner*—Tan T. Nguyen
(74) *Attorney, Agent, or Firm*—Wade James Brady, III; Frederick J. Telecky, Jr.

(57) ABSTRACT

A dynamic random access memory (DRAM) includes a Y-select circuit (218) that connects a pair of bit lines (204*a* and 204*b*) to a pair of sense nodes (210*a* and 210*b*). The Y-select circuit (218) provides a first impedance in a read operation, and a second impedance that is lower than the first impedance, in a write operation. Changes in Y-select circuit (218) impedance are achieved by driving transistors (N210*a* and N210*b*) within the Y-select circuit (218) with a first voltage during a read operation, and a second voltage during a write operation.

20 Claims, 4 Drawing Sheets

SEMICONDUCTOR MEMORY DEVICE HAVING Y-SELECT GATE VOLTAGE THAT VARIES ACCORDING TO MEMORY CELL ACCESS OPERATION

This application claims priority under 35 USC §119(e)(1) of provisional application No. 60/102,122 filed Sep. 28, 1998.

TECHNICAL FIELD

The present invention relates generally to semiconductor memory devices, and more particularly to the Y-select circuits within semiconductor memory devices.

BACKGROUND OF THE INVENTION

Semiconductor memory devices typically have a large number of memory cells arranged into one or more arrays. The memory cells can be accessed by activating a word line which connects a row of memory cells to bit lines, thereby providing access to the row of memory cells. In the event the access is a read operation, output data signals are provided by the memory cells. In the event the access is a write operation (or for some memory devices a program or erase operation), input data signals will be provided on the bit lines. In order to provide as dense a memory device as possible, the memory cells are usually made as small as possible. For many memory cell types, dynamic random access memory (DRAM) cells as just one example, a smaller memory cell size results in a correspondingly smaller output data signal.

Most memory cells include an access transistor that is situated between a bit line and the data-storing portion of the memory cell. As just a few examples, in the case of DRAM cell, an access transistor is situated between a storage capacitor and an associated bit line. In the case of a static RAM (SRAM), one or more access transistors are situated between a latching circuit and one or more bit lines. In the case of a one-transistor (1-T) electrically programmable read-only-memory (EEPROM) cell, the 1-T structure functions both as an access transistor as well as an indicator of a stored data value. Certain access transistor arrangements have result in specialized circuits.

In the case of DRAMs, the access transistor is usually an n-channel metal-oxide-semiconductor (NMOS) transistor that is turned on by the application of a positive gate voltage. In order to prevent the NMOS transistor from introducing a threshold voltage drop between its capacitor and bit line, many DRAMs drive the gates of their access transistors with a "pumped" voltage. The pumped voltage (VPP) is a voltage that is greater than the high supply voltage (VCC) of a DRAM. An example of the utilization of a pumped voltage in a DRAM write, read and refresh operation, will be explained in conjunction with FIG. 1.

FIG. 1 sets forth a portion of memory cell array 100 including four memory cells (M00–M11) formed at the intersection of two bit lines (102a and 102b) and four word lines (104a–104d). Each memory cell includes an NMOS access transistor N100 and a storage capacitor C100. In writing a logic "1" to memory cell M00, bit line 102a is driven to the VCC voltage. With bit line 102a at the VCC level, word line 104a is driven to the VPP voltage. With the VPP level at its gate, transistor N100 within memory cell M00 couples a full VCC level to its corresponding storage capacitor C100. This provides as great a charging action as is possible. In a read operation that accesses memory cell M00, word line 104a is driven to the VPP voltage. In this arrangement, in the event memory cell M00 stores a logic 1 (its capacitor C100 is charged), a large amount of the charge stored in the storage capacitor C100 of memory cell M00 is rapidly placed on bit line 102a. The bit line 102a can be subsequently driven to the full VCC level by a sense amplifier 108 coupled to the bit line. A refresh operation of cell M00 is essentially the same as the read operation.

Circuits for generating VPP voltages are now very common in many DRAMs. As a result, such DRAMs will include a low power supply voltage, a high power supply voltage, and the additional, pumped supply voltage.

FIG. 1 also illustrates typical access circuits for a DRAM. In FIG. 1, bit lines 102a and 102b can be considered a bit line pair. This bit line pair (102a and 102b) is shown to be connected to a pair of sense nodes (106a and 106b) by a pair of pass transistors (N102a and N102b). The pass transistors (N102a and N102b) are commonly activated by a pass signal (PASS). When the PASS signal is active (high), a low impedance path is provided between the pair of bit lines (102a and 102b) and the sense nodes (106a and 106b). The sense amplifier 108 is disposed between the sense nodes (106a and 106b), and serves to amplify voltage differentials between the sense nodes (106a and 106b). In FIG. 1, in a write operation input data to the bit line pair (102a and 102b) is provided from two data nodes (110a and 110b). In a read operation, output data from the bit line pair (102a and 102b) is provided at the two data nodes (110a and 110b).

A signal path between the data nodes (110a and 110b) and the sense nodes (106a and 106b) is provided by a pair of "Y-select" transistors (N104a and N104b). Y-select transistors derive their name from the fact that they access a particular memory array column (which is disposed in the Y-direction of the array, the rows being disposed in the X direction). As shown in FIG. 1, transistors (N104a and N104b) are commonly enabled by a Y-select signal (YSEL).

The conflicting requirements of read operations and write operations have required compromises in the approach to creating the Y-select transistors (N104a and N104b). In addition, the same conflicting requirements can lead to burdensome design changes when optimal read and write operations are sought. For read operations, it is desirable to have a high noise margin. In the event the Y-select transistors and the size of the sense amplifier devices are too large, the logic "0" signal will degrade, and can result in an erroneous data sensing operation. At the same time, in order to minimize the amount of time required between consecutive read operations, it is desirable to limit the voltage swing on the data lines (110a and 110b). By doing so, the speed at which the data lines (110a and 110b) can be driven from one logic state to an opposite logic state can be increased. The requirements for an optimal read operation (increased noise margin and reduced output data signal swing) can both be served by making the Y-select transistors (N104a and N104b) relatively small devices. Accordingly, for optimal read operation results, the Y-select transistor (N104a and N104b) channel widths should be small.

Optimizing Y-select transistor sizes for read operations can adversely affect write operations, however. In order to make the write operation as fast as possible, input data signals on the data lines (110a and 110b) should drive the sense nodes (106a and 106b) as rapidly as possible. It is therefore desirable to have the Y-select transistors (N104a and N104b) provide as low a resistance as possible during a write operation. Thus, for optimal write operation results, the Y-select transistor (N104a and N104b) channel widths should be large. This is in contradiction to the optimal transistor sizing for read operations.

The conflicting requirements of read and write operations has resulted in conventional approaches striking a compromise in the sizing of the Y-select transistors (N104a and N104b). Transistor size, and hence write speed, is traded off in order to provide acceptable read functionality. Due to unpredictable process variations, which can affect various portions of the entire data path, it may not always be possible to select the exact Y-select transistor sizes necessary. As a result, an initial manufactured product may provide inadequate performance, or even be nonfunctional because the Y-select transistors are either too large or too small. This requires that at least one subsequent modified design be created with re-sized Y-select transistors. Due to the critical location of Y-select transistors within the very dense memory array layout, such a re-sizing operation can be a tedious and time-consuming task. Thus, each Y-select re-sizing operation introduces a delay in the time to market of the product.

In light of the drawbacks associated with conventional approaches to designing Y-select circuits, it would be desirable to find an alternate approach to Y-select circuits that overcomes constraints of the prior art.

SUMMARY OF THE INVENTION

According to the preferred embodiment a select circuit couples data from the bit lines of a memory cell array to data lines. The select circuits provide an impedance that is dependent upon the particular type of memory cell access operation taking place. In a dynamic random access memory (DRAM) embodiment, a read operation results in the select circuits providing a relatively higher impedance to reduce noise effects and limit output signal swing on the data lines. In a write operation, the select circuits provide a lower impedance to allow rapid transfer of input data signals to the bit lines.

According to one aspect of the preferred embodiment, the select circuit impedance is altered by driving the gates of select circuit transistors with a first voltage in a read mode, and a second voltage in a write mode.

According to another aspect of the preferred embodiment, the select circuit impedance is altered by driving the gates of select circuit transistors with a first power supply voltage in a read mode, and a pumped, higher-than-supply voltage in a write mode.

An advantage of the preferred embodiment is that the impedance provided by the select circuits can be altered without requiring the transistors of select circuits to be resized.

DETAILED DESCRIPTION OF THE EMBODIMENTS

The preferred embodiment is a dynamic random access memory (DRAM) Y-select circuit that couples a bit line to selected data lines according to an applied select signal. The select circuit provides an impedance that varies according to the particular DRAM memory cell access taking place. In a read operation, the select circuit provides an impedance that is sufficient to dampen noise effects and limit the resulting magnitude of voltage signals on the data lines. In a write operation, the select circuit provides an impedance that is lower than that of a read operation, thereby allowing data signals to be rapidly coupled to sense amplifier nodes (and hence corresponding bit lines). Variations in the impedance of the select circuits are accomplished by utilizing metal (conductor)-oxide(insulator)-semiconductor (MOS) transistors within the select circuits. The gates of the MOS transistors are driven by a first voltage in one mode and a second voltage in another mode.

Figure 1:
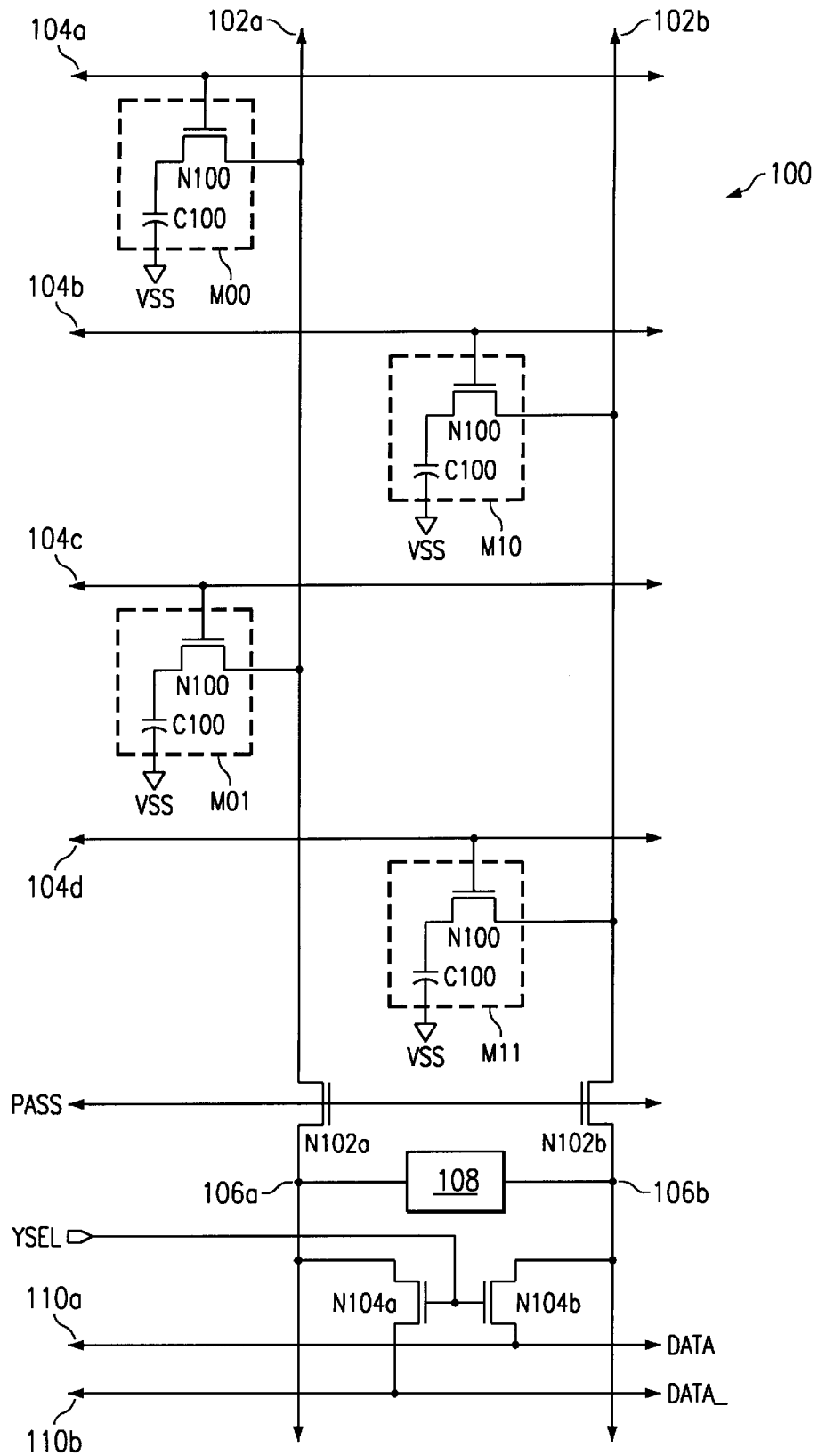
FIG. 1 is a schematic diagram of a prior art DRAM array and associated circuits.
Figure 2:
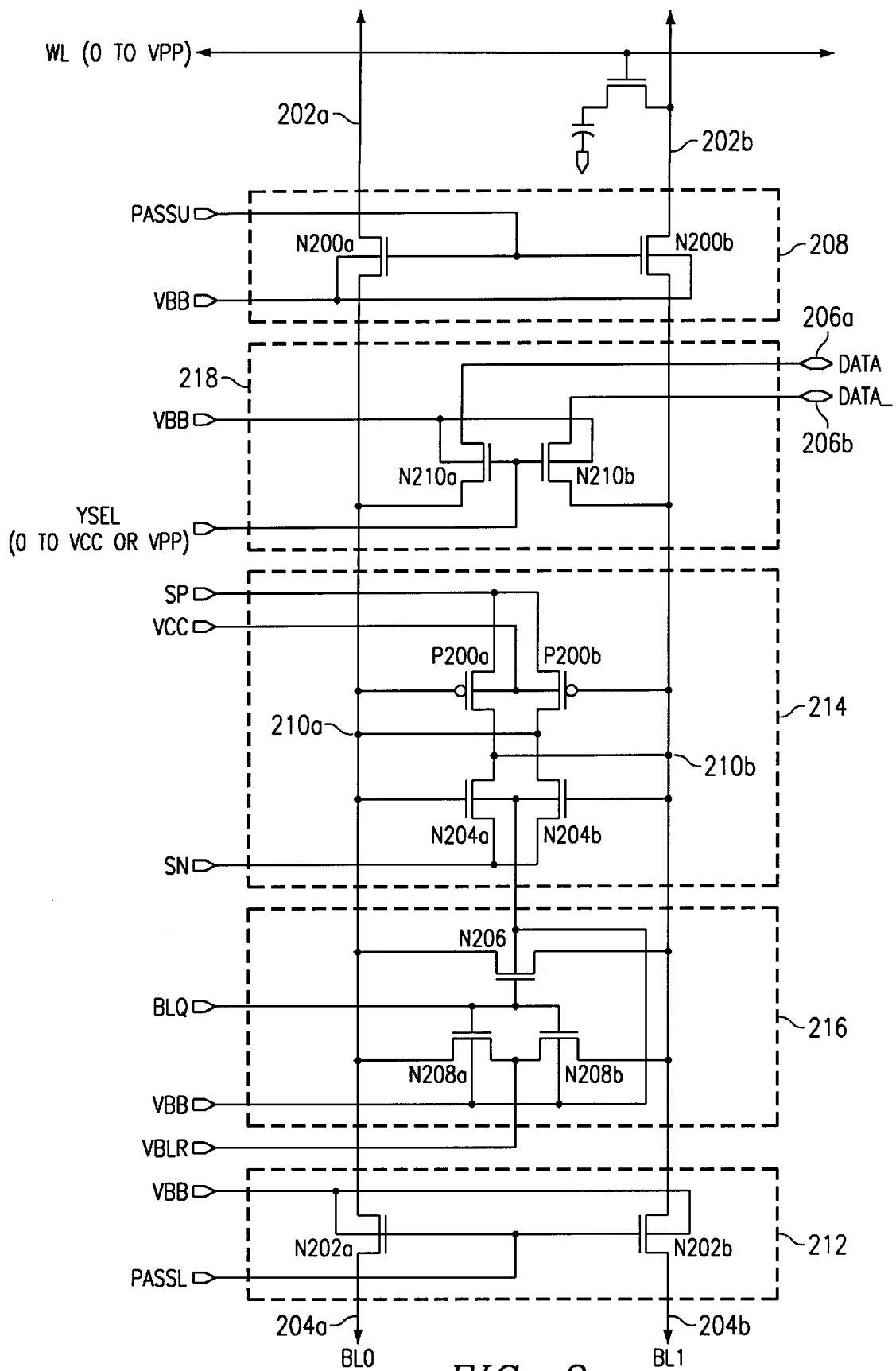
FIG. 2 is a detailed schematic diagram of the DRAM Y-select arrangement of a preferred embodiment.

The preferred embodiment is set forth in a detailed schematic diagram in FIG. 2, and designated by the general reference character 200. The preferred embodiment 200 is disposed between a pair of upper bit lines (202a and 202b) and a pair of lower bit lines (204a and 204b). The upper bit lines (202a and 202b) are coupled to an upper memory cell array, and the lower bit lines (204a and 204b) are coupled to a lower memory cell array. In the preferred embodiment 200 arrangement, a data path is created between a pair of data lines (206a and 206b) and either the upper bit line pair (202a/202b) or the lower bit line pair (204a/204b). In this manner data is either read from, or written to, memory cells within the upper array or lower array.

The preferred embodiment 200 can be conceptualized as including an upper passgate circuit 208 that couples the upper bit line pair (202a/202b) to a pair of sense nodes (210a and 210b), and a lower passgate circuit 212, that couples the lower bit line pair (204a/204b) to the sense nodes (210a and 210b). The upper passgate circuit 208 is enabled by an upper passgate signal PASSU. In a similar fashion, the lower passgate circuit 212 is enabled by a lower passgate signal PASSL. The upper passgate circuit 208 of FIG. 2 is shown to include a first upper pass n-channel MOS transistor N200a having a source-drain path coupled between upper bit line 202a and sense node 210a, and a second upper pass n-channel MOS transistor N200b having a source-drain path coupled between upper bit line 202b and sense node 210b. The gates of transistors N200a and N200b are commonly coupled to the PASSU signal. When the PASSU signal is high, transistors N200a and N200b are turned on, providing the low impedance path between the upper bit lines (202a and 202b) and sense nodes (210a and 210b). The lower passgate circuit 212 is similar to the upper passgate circuit 208, and includes a pair of lower passgate n-channel MOS transistors (N202a and N202b) having source-drain paths coupled between lower bit lines (204a and 204b) and sense nodes (210a and 210b), respectively. The gates of transistors N202a and N202b are commonly coupled to the PASSL signal. In the preferred embodiment 200, the bodies of transistors N200a, N200b, N200c and N200d are commonly coupled to a back-bias voltage VBB. When the lower power supply voltage is zero volt, VBB is a negative voltage that is used in the array portion of a DRAM device.

As set forth in FIG. 2, the preferred embodiment 200 is shown to further include a sense amplifier circuit 214 and an equalization circuit 216 situated between the sense nodes (210a and 210b). The particular sense amplifier circuit 214 of FIG. 2 is essentially composed of two cross-coupled inverters. The first inverter includes a p-channel MOS sense transistor P200a coupled in series with an n-channel MOS sense transistor N204a. The second inverter has the same arrangement, and includes a p-channel MOS transistor P200b in series with n-channel MOS transistor N204b. The input of the first inverter (formed by the common gates of transistors P200a and N204a) is coupled to sense node 210a. The output of the first inverter (formed by the drain-drain connection of transistors P200a and N204a) is coupled to sense node 210b. In a mirror image fashion, the input of the second inverter (the common gates of transistors P200b and N204b) is coupled to sense node 210b, while the output of the second inverter (the drain-drain connection of transistors P200b and N204b) is coupled to sense node 210a. In the preferred embodiment 200 the bodies of transistors P200a and P200b are commonly coupled to a high power supply voltage VCC. The bodies of transistors N204a and N204b are commonly coupled to the VBB voltage.

The equalization circuit 216 serves to equalize the potential between the sense nodes (210a and 210b) and to also place a reference voltage VBLR on the sense nodes (210a and 210b). The particular equalization circuit 216 of FIG. 2 is shown to include an n-channel equalization transistor N206 having a source-drain path coupled between the sense nodes (210a and 210b). In addition, first and second n-channel MOS reference transistors (N208a and N208b) have their source-drain paths coupled between the reference voltage VBLR and sense nodes 210a and 210b, respectively. Transistors N206, N208a and N208b have gates that are commonly coupled to an equalization signal BLQ. Thus, when BLQ is high, the sense nodes (210a and 210b) are coupled to one another, and to the VBLR voltage, as well.

The preferred embodiment 200 also includes a Y-select circuit 218 coupled to the sense nodes (210a and 210b). The Y-select circuit 218, when activated, couples the sense nodes (210a and 210b) to the data line pair (206a and 206b). In this manner, provided either the upper passgate circuit 208 or lower passgate circuit 212 is enabled, access will be provided between a bit line pair (202a/202b or 204a/204b) and the data line pair (210a and 210b). In the particular embodiment of FIG. 2, the Y-select circuit 218 includes a first n-channel MOS select transistor N210a having a source-drain path coupled between sense node 210a and data line 206a. A second n-channel MOS select transistor N210b has a source-drain path coupled between sense node 210b and data line 206b. The bodies of transistors N210a and N210b are commonly coupled to the VBB voltage.

The Y-select circuit 218 of the preferred embodiment 200 is activated by a Y-select signal YSEL. When the Y-select signal is driven to a high voltage, transistors N210a and N210b are turned on, providing a relatively low impedance path between the data lines (206a and 206b) and sense nodes (210a and 210b). When Y-select signal is driven to a low voltage, transistors N210a and N210b are turned off, isolating the data lines (206a and 206b) from sense nodes (210a and 210b). Unlike conventional Y-select circuits, the low impedance provided by the Y-select circuit 218 will depend upon the data access operation taking place. This is accomplished by providing two high voltage levels for the Y-select signal. In a read operation, the Y-select signal will be driven to a first high voltage, resulting in a first low impedance provided by the source-drain path of transistors N210a and N210b. In addition, in a write operation, the Y-select signal will be driven to a second high voltage, that is greater than the first high voltage. As a result, the source-drain paths of transistors N210a and N210b have a second low impedance that is less than the first low impedance.

The variable Y-select circuit 218 impedance of the preferred embodiment 200 can provide performance and design advantages over the prior art. Prior art Y-select circuit approaches provide a single impedance for both read operations and write operations, requiring a tradeoff between read performance and write performance. In contrast, the preferred embodiment 200, by varying the impedance with the signal YSEL, can provide a Y-select circuit 218 impedance that is optimized for both read and write operations.

In the preferred embodiment 200 the first high voltage of the YSEL signal is provided by the high power supply voltage VCC. The second high voltage is provided by a pumped supply voltage, VPP. The VPP voltage is commonly provided on many DRAMs for driving the word lines. In this manner, the preferred embodiment 200 advantageously utilizes voltage supplies already present on a DRAM, and does not require circuits specifically dedicated to generating the high voltages for the YSEL signal.

Figure 3:
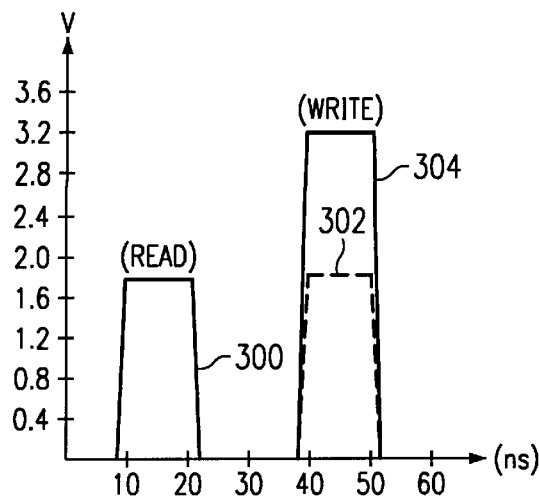
FIG. 3 is a timing diagram illustrating the Y-select signals for read and write operations according to a conventional approach, and according to the preferred embodiment.

Referring now to FIG. 3 a number of waveforms are set forth illustrating the difference in YSEL signal levels for a conventional Y-select circuit and the preferred embodiment 200. The Y-axis of the graph of FIG. 3 sets forth the voltage level of the Y-select signal. The X-axis is a time scale. A first waveform 300 is shown to occur approximately between 10 ns and 20 ns. The first waveform 300 sets forth the YSEL signal response for a read operation in a conventional case as well as in the preferred embodiment 200. The YSEL signal is driven between a low power supply level (0 volts in this case) and the high power supply level (1.8 volts in this case). A second waveform 302 is set forth approximately between 40 ns and 50 ns. The second waveform 302 illustrates the YSEL response for a write operation in a conventional case. The YSEL signal is shown to rise to the same level as the first waveform 300. FIG. 3 further includes a third waveform 304. The third waveform 304 illustrates the response of the YSEL signal in a write operation of the preferred embodiment 200. As shown by the response, by utilizing the VPP voltage, the YSEL signal is boosted approximately 1.4 volts above the VCC level to approximately 3.2 volts.

Figure 4:
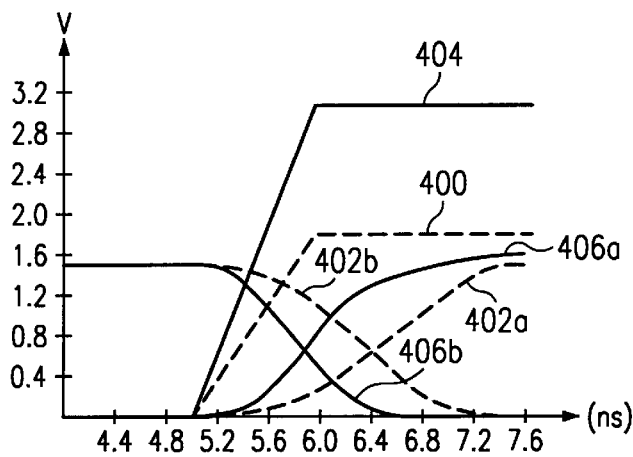
FIG. 4 is a timing diagram illustrating a conventional write response and a write response according to the preferred embodiment with larger Y-select circuit transistor sizes.

The use of multiple voltages for driving the gates of Y-select circuit 218 devices can result in faster DRAM operations. In particular, a higher Y-select circuit 218 driving voltage could result in faster write speeds. Such improvements in write speed are represented by a timing diagram in FIG. 4. FIG. 4 sets forth simulated write responses for a Y-select arrangement, such as that set forth in FIG. 2. Two responses are illustrated for the same circuit. A first response is set forth in dashed waveforms, and illustrates a conventional write operation utilizing a gate voltage for the Y-select circuit devices of 1.8 volts. The two n-channel transistors (N210a and N210b) of the Y-select circuit 218 are assumed to have a size, given by a width-to-length ratio (W/L), of 1.4 microns (um)/0.2 um.

The first response includes the YSEL signal 400, which is shown to rise from 0 volts to 1.8 volts between about 5 nanoseconds (ns) and 6 ns. The response of a bit line pair is illustrates by waveforms 402a and 402b. Initially bit line response 402a is at a low logic level (0 volts), and complementary bit line response 402b is initially at a high logic level (1.8 volts). The write operation drives the bit lines to opposite logic values. At approximately 6.5 ns, the bit line responses (402a and 402b) "cross-over." By approximately 8 ns, the bit line pair responses (402a and 402b) are essentially at opposite logic states. The write operation is complete.

The response of a preferred embodiment is set forth in solid waveforms, and represents the same Y-select circuit, but with the n-channel MOS devices (N210a and N210b) having gates that are driven to a pumped voltage of 3.1 volts. The resulting YSEL signal is shown as waveform 404, and is shown to rise from 0 volts to 3.1 volts between about 5 ns and 6 ns. As in the case of the first response (400, 402a and 402b), the preferred embodiment response sets forth the response of a bit line pair (406a and 406b). The bit line pair responses (406a and 406b) are in an initial logic state, and driven to an opposite logic state by the write operation. The preferred embodiment response (404, 406a and 406b) illustrates the response for the same size Y-select n-channel MOS devices (W/L=1.4 um/0.2 um). As shown by the figure, the preferred embodiment response (404, 406a and 406b) results in the bit line responses (406a and 406b) crossing over one another at about 5.9 ns. Furthermore, essentially full logic levels for the bit line responses are achieved by 6.8 ns. In this manner, the use of lower Y-select impedance can improve write speeds.

Figure 5:
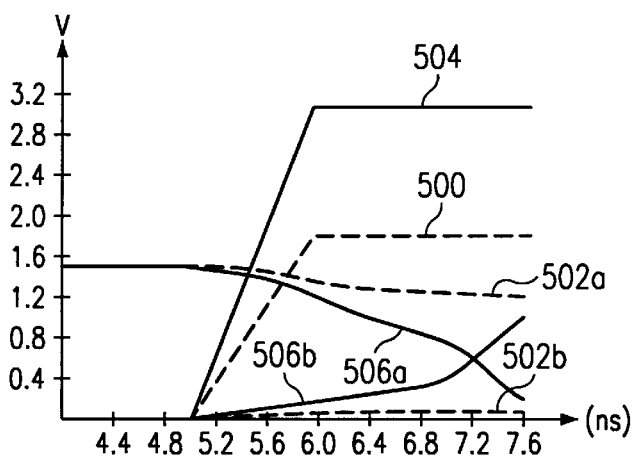
FIG. 5 is a timing diagram illustrating a conventional write response and a write response according to the preferred embodiment with smaller Y-select circuit transistor sizes.

In addition to allowing for faster write operations, the preferred embodiment can allow for smaller Y-select devices, thus contributing to a more compact overall semiconductor device. This is best illustrated by FIG. 5. FIG. 5 is a timing diagram illustrating the simulation of a write operation such as that set forth in FIG. 4. However, the responses of FIG. 5 illustrate a case in which smaller Y-select circuit devices (i.e., transistors N210a and N210b in the case of FIG. 2) are used. Instead of the having W/Ls of 1.4 um/0.2 um, the Y-select transistors for FIG. 5 have smaller W/Ls of 0.4 um/0.2 um. In FIG. 5, two responses are set forth. A first response, set forth by dashed waveforms, illustrates the result of the smaller Y-select circuit transistors when a conventional gate voltage of 1.8 volts is used. The YSEL signal is shown as waveform 500 and the resulting bit line pair response is shown by waveforms 502a and 502b. Waveform 502a is initially at a high logic level, while waveform 502b is initially at a low logic level. In order for the proper data to be written, the bit line pair response (502a and 502b) must be driven to opposite logic levels. As shown by the conventional response (500, 502a and 502b), when smaller Y-select transistors are used are used in conjunction with a conventional voltage (i.e., 1.8 volts), the write response fails, as the bit lines are not driven to opposite logic values. This illustrates how conventional Y-select circuit approaches require select transistors of a minimum size.

The preferred embodiment response is illustrated in FIG. 5 by the waveform 504, which sets forth the higher pumped YSEL signal, as well as the resulting bit line pair response (506a and 506b). As shown by the preferred embodiment response (504, 506a and 506b), a successful write operation occurs with the bit line responses (506a and 506b) crossing over one another at about 7.2 ns, and eventually achieving full logic values at around 8.0 ns.

Figure 6A:
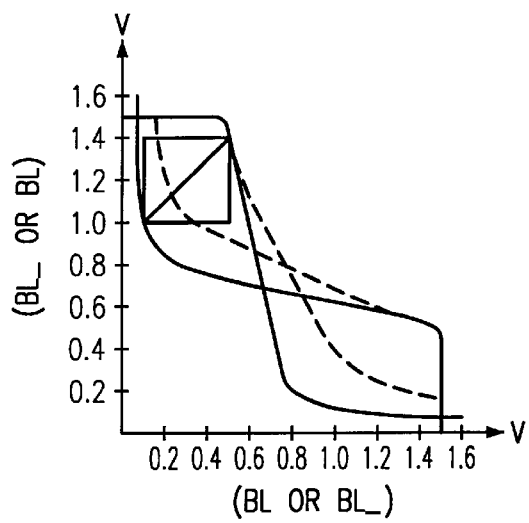
FIGS. 6a and 6b are graphs illustrating the effect of Y-select transistor size on the static noise margin for conventional read and write operations.
Figure 6B:
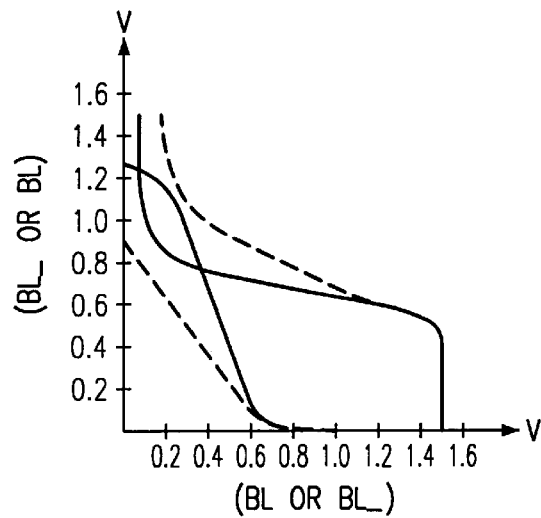

Referring now to FIGS. 6a and 6b, an estimation for the static noise margin (SNM) of the Y-select circuit set forth in FIG. 2 is illustrated in a graph. The SNM is the maximum static noise that can be tolerated before the sense amplifier will "flip" and thereby change logic states. Static noise is those dc disturbances arising from processing and operating variations.

The graphs of FIGS. 6a and 6b set forth a read operation and write operation, respectively, for Y-select transistors of different sizes. In particular, in FIG. 6a dashed lines response provides an estimation for the SNM in a read operation for Y-select transistors having W/L sizes of 1.4 um/0.2 um. It is assumed that the Y-select gate voltage is a "conventional" 1.8 volts. On the same graph, illustrated by solid lines, is the SNM can be estimated for the same read operation, but with Y-select transistors having smaller W/Ls of 0.4 um/0.2 um. The SNM can be estimated by drawing and mirroring the bit line responses and finding the maximum square between them. Put in another way, one waveform would illustrate the response of sense node 210a to variations in sense node 210b, while the other waveform illustrates the response of sense node 210b to variations in sense node 210a. In the case of the read operation, the characteristics are essentially the response of each cross-coupled inverter in the sense amplifier taking into account the resistance of the Y-select devices. Thus, one curve response will illustrate how the variations of a first bit line (BL) effect a second bit line (BL_), while the other represents how variations of the second bit line (BL_) effect a first bit line (BL). For illustrative purposes, a maximum size square for the smaller transistor response (the solid lines) is set forth. As shown by the FIG. 6a, and noted above, the smaller Y-select transistors provide greater noise margin, and so are more desirable for read operations.

A write operation is represented in FIG. 6b, and sets forth a first response in dashed lines and a second response in solid lines. The first response illustrates a case where the larger size Y-select transistors (i.e., W/L=1.4 um/0.2 um) are used. The second response illustrates a write operation in which the smaller size Y-select transistors are used. By comparing the two curves of each response, it is shown that the write operation fails in the case of the second response. In the first response (the dashed lines), the two curves result in the logic between the bit lines being maintained at the desired write logic value. In the second response (the solid lines), the two curves illustrate how the write operation fails. Because the solid curves cross over one another, the write operation will remain in the opposite logic state to that which is desired.

Thus, FIGS. 6a and 6b help to illustrate how smaller Y-select transistor sizes provide superior read operation and inferior write operation responses with a conventional approach. Similarly, larger Y-select transistor sizes provide inferior read operation and superior write operation noise responses.

Figure 7A:
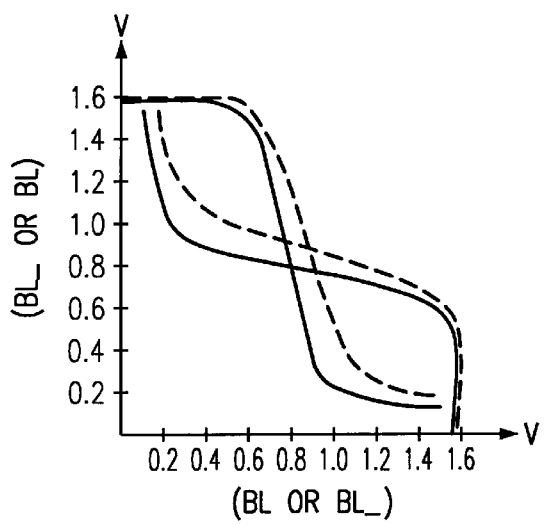
FIGS. 7a and 7b are graphs illustrating the affect of Y-select transistor size on the static noise margin for read and write operations when the gates of the Y-select transistors are driven by an increased voltage.
Figure 7B:
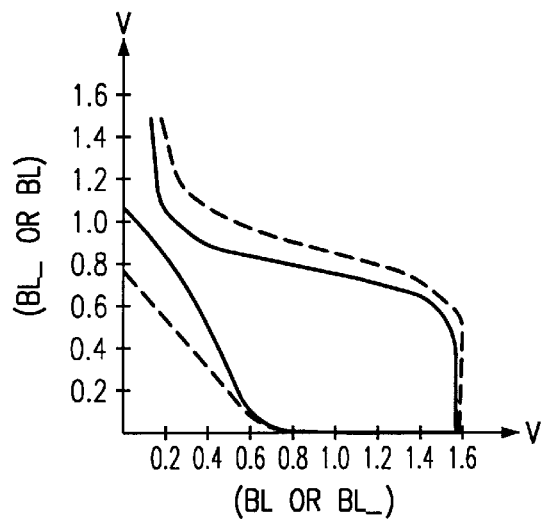

FIGS. 7a and 7b, like FIGS. 6a and 6b, illustrate the SNM response for a read and write operation for Y-select transistors of different sizes. Unlike FIGS. 6a and 6b, which illustrate a conventional Y-select voltage level, FIGS. 7a and 7b illustrate the case where an increased YSEL signal of 3.1 volts is used. FIG. 7a illustrates an estimation of the SNM for read operations. The dashed lines represent the resulting SNM estimation for Y-select transistors of the larger size (W/L=1.4 um/0.2 um). The solid lines represent the SNM estimation for Y-select transistors of the smaller size (W/L= 0.4 um/0.2 um).

FIG. 7b illustrates the resulting the same SNM projection of responses for write operations at the higher YSEL voltage. As in the case of FIG. 6b, the dashed lines illustrate the response for the larger YSEL transistor size (W/L=1.4 um/0.2 um), while the solid lines illustrate the response for the smaller YSEL transistor size (W/L=0.4 um/0.2 um). Unlike the smaller transistor case of FIG. 6b, the smaller transistor case of FIG. 7b results in a proper write operations taking place. Thus, the response of 7b illustrates how the larger YSEL voltage level, while not ideal for a read operation, does allow write operations to take place with smaller transistors—write operations that are not possible at the lower conventional YSEL voltages.

In summary, FIGS. 6a, 6b, 7a and 7b, illustrate how the preferred embodiment can utilize smaller Y-select transistors in read operations at conventional voltages for increased noise margins, and then use a pumped YSEL signal to allow the same Y-select transistors to be used in write operations. Smaller Y-select transistors can provide a more compact overall semiconductor device.

Yet another performance advantage of the preferred embodiment relates to the critical timing requirements of many semiconductor devices. By driving the Y-select signal between higher voltages (between a low power supply voltage and a higher-than-supply voltage), the speed at which the Y-select signal will turn on devices within the Y-select circuit can be increased. This allows for tighter timing schemes, which can be particularly advantageous in data sensing operations. For example, the timing between the activation of the sense amplifier (the signal SP going high and the signal SN going low in FIG. 2), and the Y-select signal (YSEL in FIG. 2) can mean the difference between a correct and erroneous write operation. In this manner, the preferred embodiment can provide Y-select timing advantages over the prior art.

In addition to providing improved performance, the use of different Y-select voltages according to a particular access operation (such as a read and write operation), provides advantages in other areas as well. In the event the use of different Y-select voltages on an initial prototype run does not result in optimal Y-select circuit impedance, adjustments can be made that do not require burdensome device re-sizing steps. Instead, the voltage can be adjusted, to provide a higher or lower Y-select voltage, and thereby provide a lower or higher Y-select circuit impedance. Such a change in voltage is less burdensome, as it can be accomplished via a "metal" option (a different photomask for an interconnect layer), or even via fusible links or the like. In this manner, a device implementing the preferred embodiment can be rapidly brought to market, and thus be more profitable.

It is understood that although the present invention has been described in terms of a detailed dynamic random access memory (DRAM) embodiment, the teachings set forth herein may be applicable to other types of semiconductor devices having data paths to a data providing circuit. This could include programmable logic devices in addition to semiconductor memory devices. Furthermore, while the preferred embodiment utilizes the advantageous common noise rejection qualities of a "folded" bit line structure, the teachings set forth herein may also be applied to "open" bit line structures. Accordingly, it should be understood that various changes, substitutions, and alterations could be made without departing from the spirit and scope of the invention as defined by the appended claims.

What is claimed is:

1. A semiconductor memory device, comprising:
   a first supply voltage node coupled to a first supply voltage;
   a second supply voltage node coupled to a second supply voltage having a greater magnitude than the first supply voltage;
   a plurality of bit lines;
   at least one data line; and
   a plurality of select devices, each select device receiving a designated select signal and providing a controllable impedance path between the at least one data line and a predetermined bit line, the impedance of the controllable impedance path being dependent upon the magnitude of the designated select signal, the designated select signal being driven according to the potential at the first supply node in a first mode, the designated select signal being driven according to the potential at the second supply node in a second mode.

2. The semiconductor memory device of claim 1, wherein:
   the first supply voltage is a high power supply voltage; and
   the second supply voltage is a supply voltage that is higher than the high power supply voltage.

3. The semiconductor memory device of claim 2, further including:
   a plurality of memory cells that store data, the data within each memory cell being accessed by the application of the second supply voltage to the memory cell.

4. The semiconductor memory device of claim 3, wherein:
   the memory cells are dynamic random access memory (DRAM) cells, each including a storage capacitor and an access insulated gate field effect transistor (IGFET) having a control gate, the second supply voltage being applied to the control gate of the access IGFET in a read mode.

5. The semiconductor memory device of claim 1, further including:
   a pass transistor associated with each bit line, each pass transistor coupling its associated bit line to one of the select devices.

6. The semiconductor memory device of claim 1, wherein:
   each select device includes a select IGFET having a source-drain path and a control gate, the controllable impedance path including the source-drain path of the select IGFET, the control gate of the select IGFET receiving the designated select signal.

7. The semiconductor memory device of claim 1, wherein:
   the plurality of bit lines are arranged in bit line pairs;
   the at least one data lines are arranged into data line pairs;
   the plurality of select devices include select device pairs, each select device pair receiving a designated select signal and providing a controllable impedance path between a pair of data lines and a predetermined pair of bit lines, the impedance of the controllable impedance paths of each select device pair being commonly dependent upon the magnitude of the designated select signal.

8. A semiconductor memory device having at least two data access operations, the semiconductor memory device, comprising:
   a plurality of data lines;
   a plurality of bit lines;
   a plurality of select transistors, each select transistor including a control terminal and a current path, each control terminal receiving a select signal, and the current path of each select transistor being disposed between one of the data lines and one of the bit lines, each select transistor being enabled when the select signal at its control terminal is active, the active select signals having a first magnitude in a first access operation, the active select signal having a second magnitude in a second access operation; and a plurality of memory cells coupled to the bit lines.

9. The semiconductor memory device of claim 8, wherein:

the select transistors are insulated gate field effect transistors (IGFETs) and the active select signals are voltage signals.

10. The semiconductor memory device of claim 9, wherein:

the select transistors are n-channel IGFETs and the active select signals are positive voltage signals.

11. The semiconductor memory device of claim 10, wherein:

the first access operation is a read operation and the second access operation is a write operation, the second magnitude being greater than the first magnitude.

12. The semiconductor memory device of claim 11, wherein:

the semiconductor memory device receives a power supply voltage, the power supply voltage having the first magnitude.

13. The semiconductor memory device of claim 11, wherein:

the memory cells each include an access transistor, each access transistor including a control terminal and a current path, the control terminal of each access transistor receiving a cell select signal, the current path of each access transistor being disposed between one of the bit lines and one of the select transistors, each access transistor being enabled when its respective cell select signal is active, an active cell select signal having the second magnitude.

14. A data access scheme for a semiconductor memory device, the data access scheme comprising:

a plurality of differential amplifiers;

a plurality of bit lines, each bit line being coupled to a number of memory cells;

a plurality of passgate circuits disposed between the bit lines and the differential amplifiers;

a plurality of data lines; and a plurality of select circuits disposed between the data lines and the differential amplifiers, each select circuit, when enabled, providing a conductive path between selected bit lines and data lines, each conductive path having a first impedance in a first mode and a second impedance in a second mode.

15. The data sensing scheme of claim 14, wherein:

each differential amplifier includes a first node and a second node, and amplifies the difference between the two nodes; and each passgate circuit couples a pair of bit lines to the first and second nodes of a sense amplifier.

16. The data sensing scheme of claim 14, wherein:

each differential amplifier includes a first node and a second node, and amplifies the difference between the two nodes; and each select circuit couples a pair of data lines to the first and second nodes of a sense amplifier.

17. The data sensing scheme of claim 14, wherein:

the memory cells are dynamic random access memory (DRAM) cells; and the first impedance is less than the second impedance, and the first mode is a write mode and the second mode is a read mode.

18. The data sensing scheme of claim 14, wherein:

the bit lines include first bit lines coupled to the memory cells of a first array, and second bit lines coupled to the memory cells of a second array;

the passgate circuits include first passgate circuits disposed between the first bit lines and the differential amplifiers, and second passgate circuits coupled between the second bit lines and the differential amplifiers.

19. The data sensing scheme of claim 18, wherein:

each differential amplifier includes a first node and a second node, and amplifies the difference between the two nodes; and each first passgate circuit couples a pair of first bit lines to the first and second nodes of a sense amplifier, and each second passgate circuit couples a pair of second bit lines to the first and second nodes of the sense amplifier.

20. The data sensing scheme of claim 14, wherein:

each select circuit is enabled by a select signal, the select signal having a first voltage in the first mode and a second voltage in the second mode.

* * * * *